United States Patent
Evans et al.

(10) Patent No.: US 8,290,830 B2
(45) Date of Patent: Oct. 16, 2012

(54) SYSTEM AND METHOD FOR VISUALIZATION AND COMPARISON OF PHYSICAL ASSETS USING ENGINEERING DESIGN DATA

(75) Inventors: Frances Elizabeth Evans, Seattle, WA (US); Phillip Ross, Arlington, TX (US)

(73) Assignee: Siemens Product Lifecycle Management Software Inc., Plano, TX (US)

( * ) Notice: Subject to any disclaimer, the term of this patent is extended or adjusted under 35 U.S.C. 154(b) by 399 days.

(21) Appl. No.: 12/755,783

(22) Filed: Apr. 7, 2010

(65) Prior Publication Data

US 2011/0251975 A1    Oct. 13, 2011

(51) Int. Cl.
*G06Q 10/00* (2012.01)
(52) U.S. Cl. .......................................... 705/27
(58) Field of Classification Search ........ 705/27
See application file for complete search history.

(56) References Cited

U.S. PATENT DOCUMENTS

| | | | |
|---|---|---|---|
| 5,307,261 A | 4/1994 | Maki et al. | |
| 5,311,424 A | 5/1994 | Mukherjee et al. | |
| 5,434,791 A | 7/1995 | Koko et al. | |
| 5,717,902 A | 2/1998 | D'Souza et al. | |
| 5,873,075 A | 2/1999 | Cochrane et al. | |
| 6,101,507 A | 8/2000 | Cane et al. | |
| 6,397,125 B1 | 5/2002 | Goldring et al. | |
| 7,136,843 B2 | 11/2006 | Bigus et al. | |
| 7,299,202 B2 * | 11/2007 | Swanson | 705/26.5 |
| 7,343,364 B2 | 3/2008 | Bram et al. | |
| 7,493,344 B2 | 2/2009 | Wald et al. | |
| 7,526,468 B2 | 4/2009 | Vincent et al. | |
| 7,680,818 B1 | 3/2010 | Fan et al. | |
| 7,685,183 B2 | 3/2010 | Pace et al. | |
| 2002/0165724 A1 | 11/2002 | Blankesteijn | |
| 2003/0120902 A1 | 6/2003 | Kottapalli et al. | |
| 2003/0212681 A1 | 11/2003 | Kasper, II | |
| 2004/0250258 A1 | 12/2004 | Raghuvir et al. | |
| 2006/0143227 A1 | 6/2006 | Helm et al. | |
| 2006/0161894 A1 | 7/2006 | Oustiougov et al. | |
| 2010/0274759 A1 | 10/2010 | Takeuchi et al. | |
| 2011/0167037 A1 | 7/2011 | Kaiser | |
| 2011/0178998 A1 | 7/2011 | Nizami et al. | |
| 2011/0179059 A1 | 7/2011 | Kaiser | |

* cited by examiner

*Primary Examiner* — Shay S Glass

(57) ABSTRACT

A PLM system, method, and computer readable medium. A method includes receiving a persistence model of a physical assembly and transforming the persistence model to a bill of materials (BOM) window that includes a plurality of BOM lines each corresponding to a physical part. The method includes constructing an engineering design structure corresponding to the physical assembly and creating a hybrid BOM window by combining the engineering design structure with the BOM window. The hybrid BOM window includes a plurality of hybrid BOM lines. The method includes displaying a BOM window view based on the hybrid BOM window.

20 Claims, 4 Drawing Sheets

SYSTEM AND METHOD FOR VISUALIZATION AND COMPARISON OF PHYSICAL ASSETS USING ENGINEERING DESIGN DATA

TECHNICAL FIELD

The present disclosure is directed, in general, to systems and methods for use in computer-aided design, manufacturing, engineering, prototype/test, maintenance, modeling, and visualization (individually and collectively, "CAD" and "CAD systems") and in product lifecycle management ("PLM") and other systems.

BACKGROUND OF THE DISCLOSURE

Many manufactured products are first designed and modeled in CAD systems, and PLM systems are used by manufacturers, retailers, customer, and other users to manage the design, use, maintenance and disposal of various products. Improved systems are desirable.

SUMMARY OF THE DISCLOSURE

Various embodiments include a PLM system, method, and computer readable medium. A method includes receiving a persistence model of a physical assembly and transforming the persistence model to a bill of materials (BOM) window that includes a plurality of BOM lines each corresponding to a physical part. The method includes constructing an engineering design structure corresponding to the physical assembly and creating a hybrid BOM window by combining the engineering design structure with the BOM window. The hybrid BOM window includes a plurality of hybrid BOM lines. The method includes displaying a BOM window view based on the hybrid BOM window.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

Figure 1:
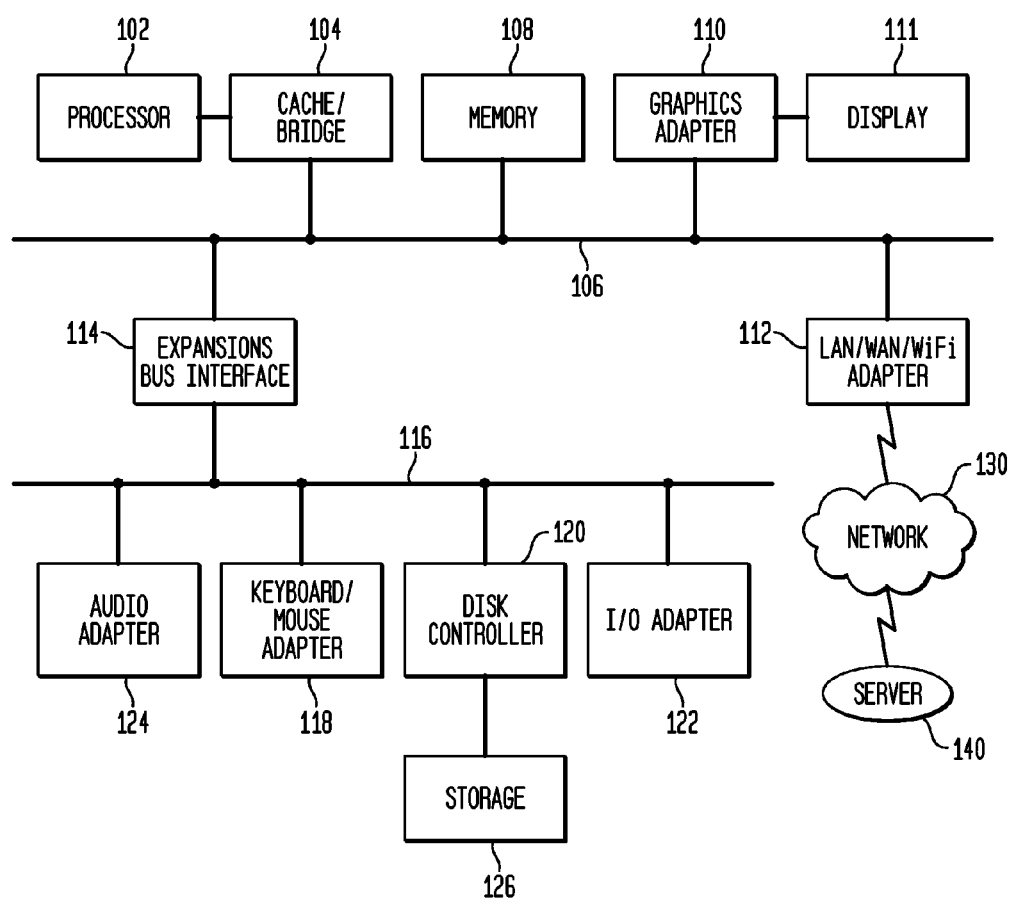
FIG. 1 depicts a block diagram of a data processing system in which an embodiment can be implemented in accordance with disclosed embodiments.

FIGS. 1 through 4, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

PLM systems can model products at many stages, including the engineering/design stage and as the product is manufactured, tested and in use, where the physical instance may differ from the "as designed" product, also referred to as a neutral product definition. As product modeling is extended to include modeling individual physical instances of products (physical assets) as well as the design specification (neutral product definition) for a set of products, a number of new challenges are presented. These can include techniques for viewing and visualizing a three-dimensional (3D) geometric representation of a single physical instance of the product, and techniques for comparing the part and position information between two physical products or between a physical product and a given engineering definition of the product Disclosed embodiments include systems and methods for extending product lifecycle management to modeling of physical assets. In various embodiments, the system can manage both the engineering definition of a product or part and specific physical instances of the product.

Disclosed systems can manage the engineering design of a product with its parts decomposition and related geometry and can also extend similar modeling concepts to manage the individual physical assets that are built from that design. In many cases, the ratio of engineering representation to physical representations of a product is 1:n, in that typically many physical assets are constructed from a given design. An engineering representation has inherent superposition of many variations of the design. For example, an engineering representation may have multiple part revisions over time, or multiple variants according to selected options. This ambiguity must be completely resolved for any given physical product that is built which must stem from a precise product configuration.

In many cases, an engineering part can appear multiple times in a given product structure or Bill of Materials (BOM) since its definition is identical and can be re-used. For example, a car design may have four instances of a Part Wheel with part number W123 in the front left, front right, rear left and rear right positions. In a given physical asset built from this design the four wheels must be represented uniquely with unique serial numbers that can be tracked.

Another difference between engineering design and physical asset descriptions is that geometric representation is authored as part of the engineering design. In most situations, it is neither practical nor necessary to author unique geometric information for a given physical asset. Further, while a physical asset is based on some engineering design configuration, it may also deviate from the parts decomposition that the engineer has documented. For example, when the product is being assembled, if the preferred part is not available, an alternate, substitute, or deviated part may be installed instead, that may or may not be an "authorized" replacement. As another example, at a particular point in time, the product may be partially assembled or partially disassembled and so its physical state will correspond to a subset of the engineering design.

Disclosed embodiments also address challenges in visualizing the engineering design and physical representations in a PLM system. In a system as disclosed herein, position information is the 3D transformation matrix that represents the position in 3D space of a part relative to its parent assembly. Shape information is a data structure or file, such as a JT file, that represents the geometry of a part, typically independently of its position.

While geometric representations and geometric position information are stored with the engineering design of a product, it is often the case that there is no configuration of the engineering product that can produce the correct visual representation of the physical asset built from that design. In some cases, the physical product may be in a partially assembled or disassembled state, or the physical product may include components not present in the design structure e.g. alternate, substitute or deviated parts which could have different shape data to those in the design. Since the physical product may be built over a period of weeks or months, some sub-systems may be built to an earlier design standard than others.

Disclosed embodiments address these issues. Both position and shape information can be overridden at an absolute occurrence level by designers. In other words, disclosed embodiment address the issue where the default transformations and geometry files for a part or assembly can be modified when those parts are used in the context of certain higher level products or assemblies. Disclosed embodiments address the problem that arises when the transform on the related design occurrence and the shape information of the neutral design part is not necessarily correct.

Disclosed embodiments provide for positional overrides for non-rigid body assemblies. For example, the shock absorber assembly may position its sub-parts in a relaxed state in its original design. However, in the context of the vehicle, the position of the connecting points is compressed.

Disclosed embodiments also address shape overrides, visual and color overrides, and alternate representation, such as when a part has multiple representations and the displayed representation can be selected according to its usage by an immediate parent.

These use cases present challenges because the data is stored in a number of different places. Position information can exist on the direct usage of a part in a parent or as an override on any higher level usage context. Similarly, shape data can exist as a direct attachment to the part revision with rules determining which dataset applies for a given situation as well as potential shape overrides in any or all higher level usage contexts. The persistent data structures used to store this type of data are complex due to managing the many different paths for each usage of a component and the various layers of overrides.

Further, in real world cases, even though a physical part cannot be in more than one place at once, it can be used in multiple parents or products over time. Disclosed embodiments can recreate correct visualization information for any of the part usages or re-usages without creating a complex storage mechanism for each usage of a physical part independently. The system can store the history and retrieve correct visualization according to which physical structure is currently being viewed.

In some embodiments, it is assumed that the transformation matrix of the alternate/substitute/deviated part is the same as the preferred engineering part for which it is a substitution. "Extra to Design" or "add-on" parts in the physical product cannot be represented in all cases since there is no position information available in the engineering design for these parts. In many cases, no shape overrides are possible for alternate, substitute or deviated parts. These limitations of various embodiments are not limitations of the techniques disclosed herein, but rather are limitations in the data available to support geometric visualization of the physical asset. Of course, in cases where such data is available, this data can be managed as part of the overall processes described herein.

Disclosed embodiments support the comparison between multiple engineering product structures, as well as comparisons between or against physical instances. Such comparisons highlight parts that exist in one product design (or configuration of a design) and not in the other, including but not limited to both physical differences and common or different properties such as part number, serial number, or any arbitrary property a user might choose to compare.

FIG. 1 depicts a block diagram of a data processing system in which an embodiment can be implemented, for example as a PLM system configured to perform processes as described herein. The data processing system depicted includes a processor 102 connected to a level two cache/bridge 104, which is connected in turn to a local system bus 106. Local system bus 106 may be, for example, a peripheral component interconnect (PCI) architecture bus. Also connected to local system bus in the depicted example are a main memory 108 and a graphics adapter 110. The graphics adapter 110 may be connected to display 111.

Other peripherals, such as local area network (LAN)/Wide Area Network/Wireless (e.g. WiFi) adapter 112, may also be connected to local system bus 106. Expansion bus interface 114 connects local system bus 106 to input/output (I/O) bus 116. I/O bus 116 is connected to keyboard/mouse adapter 118, disk controller 120, and I/O adapter 122. Disk controller 120 can be connected to a storage 126, which can be any suitable machine usable or machine readable storage medium, including but not limited to nonvolatile, hard-coded type mediums such as read only memories (ROMs) or erasable, electrically programmable read only memories (EEPROMs), magnetic tape storage, and user-recordable type mediums such as floppy disks, hard disk drives and compact disk read only memories (CD-ROMs) or digital versatile disks (DVDs), and other known optical, electrical, or magnetic storage devices.

Also connected to I/O bus 116 in the example shown is audio adapter 124, to which speakers (not shown) may be connected for playing sounds. Keyboard/mouse adapter 118 provides a connection for a pointing device (not shown), such as a mouse, trackball, trackpointer, etc.

Those of ordinary skill in the art will appreciate that the hardware depicted in FIG. 1 may vary for particular implementations. For example, other peripheral devices, such as an optical disk drive and the like, also may be used in addition or in place of the hardware depicted. The depicted example is provided for the purpose of explanation only and is not meant to imply architectural limitations with respect to the present disclosure.

A data processing system in accordance with an embodiment of the present disclosure includes an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present disclosure as described.

LAN/WAN/Wireless adapter 112 can be connected to a network 130 (not a part of data processing system 100), which can be any public or private data processing system network or combination of networks, as known to those of skill in the art, including the Internet. Data processing system 100 can communicate over network 130 with server system 140, which is also not part of data processing system 100, but can be implemented, for example, as a separate data processing system 100.

This invention accesses existing engineering part usage and geometric design data dynamically and appends this to the in-memory representation of a physical asset to enable 3D geometric visualization, navigation and compare capabilities of physical products without need for data replication or significant performance overhead. It does this by constructing a hypothetical design structure that includes the actual parts and configurations used even where these deviate from engineering intent.

Current systems support a separation from the persistent data structures used to store part structures, shape and position data, occurrence data and nested override information from its in-memory representation presented in the client of the software application, such as in memory 108 of data processing system 100. A sophisticated set of constructs and algorithms are used to correctly navigate, concatenate and apply override precedence rules to ensure that the configured product the user interacts with has all contextual data accurately accounted for.

This in-memory representation of the engineered product is referred to herein as a "BOM Window" of "BOM Lines" with a BOM Line representing each configured usage of a part in a structure. Each line is dynamically calculated by aggregating data from a number of sources and presenting it as a logical business object the user can view and manipulate. Edits to the BOM Lines are translated back into the various storage mechanisms persisted in the underlying data base.

Disclosed embodiments leverage this existing transformation from the persistent model to the BOM Window, preferably without affecting the physical asset structures being managed. This has a number of benefits, since the physical product applications do not have to re-implement this sophisticated processing and are insulated from future optimizations to the occurrence model and override mechanisms.

Specializations of "BOM Line" are used to support "As-Built" or "As-Maintained" physical structures. These specialized physical BOM Lines and processes can include one or more major components in various embodiments:

The system performs a transformation between the persistence model of the physical structure, which is considerable simpler than that of engineering occurrence based structure, to the in-memory physical BOM Line. This allows many existing client viewing functions to work seamlessly despite the difference in underlying data storage.

The system also dynamically constructs an engineering design structure that corresponds to the physical parts. Note this is almost certainly different from any structure that could be loaded and configured from within existing engineering applications since it may contain alternate, substitute, deviated or extra parts relative to the design. Additionally it may be composed of sub-systems that were based on different design configuration standards which would not be possible to configure on a pure engineering structure.

The system combines the representation of the physical parts together with the dynamically derived engineering counterpart structure into a "Hybrid BOM Window" composed of "Hybrid BOM Lines", as referred to herein. This enables each element to have both physical part data (e.g. serial number, actual part number used, missing versus installed) together with design part data (e.g. geometric position, shape data including overrides, occurrence ID etc.).

Disclosed embodiments can then use these elements to produce and display various representations of the physical structures and design structures for use and analysis by users or other systems.

Figure 2:
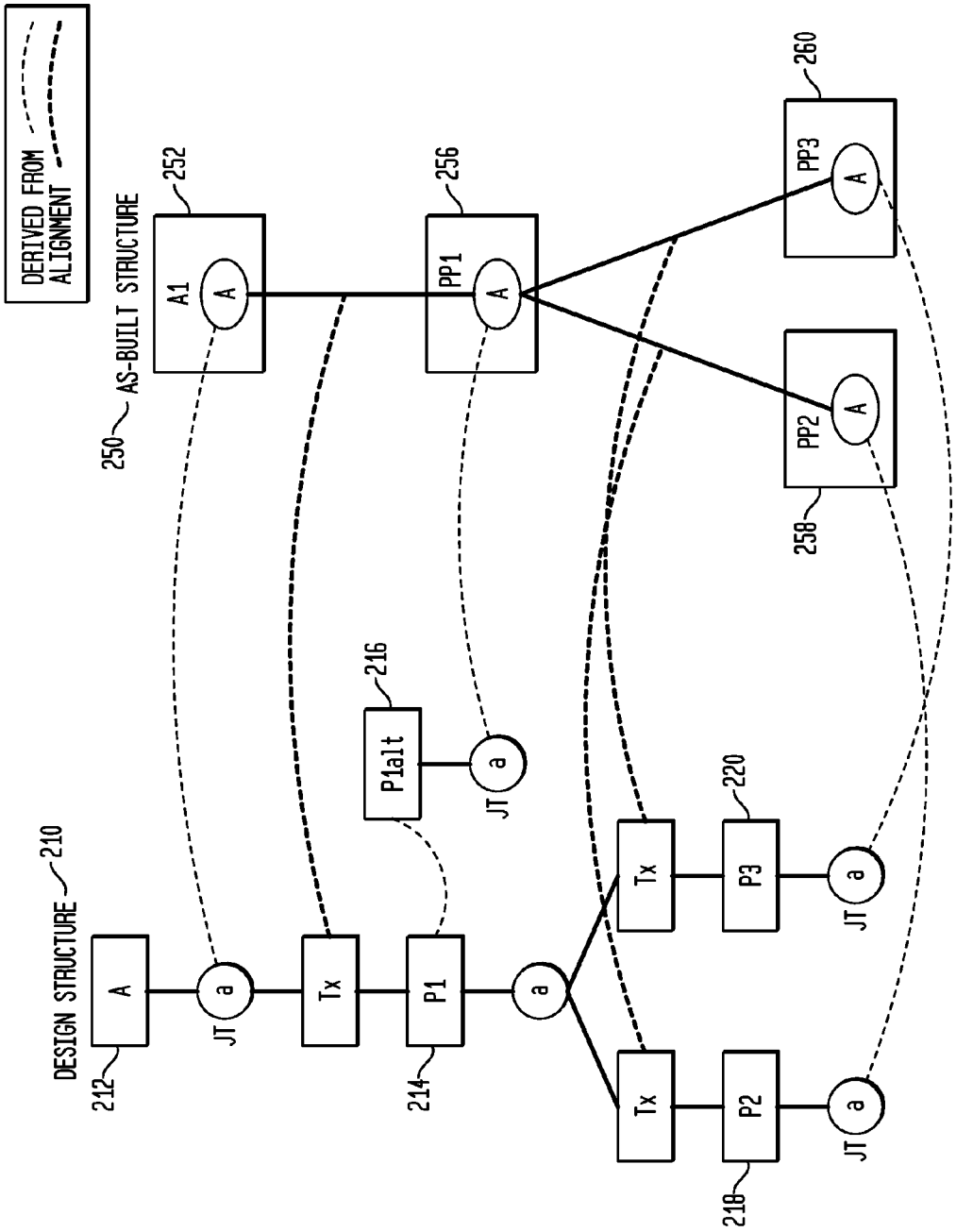
FIG. 2 illustrates an example of a product design structure and a corresponding physical structure in accordance with disclosed embodiments.

FIG. 2 illustrates an example of a product design structure and a corresponding physical structure in accordance with disclosed embodiments;

In this example, a simplified product design structure 210 is shown with a corresponding physical "as-built" structure 250. Rectangles such as assembly A 212, part P1 214, part P1 alt 216, part P2 218, and part P3 220 represent the engineering parts of the design structure 210. The corresponding circles labeled "a" are the respective revisions of those parts.

In the physical structure 250, the rectangles such as assembly A1 252, physical part PP1 256, physical part PP2 258, and physical part P3 260 represent the physical parts and the ovals labeled "A" within them represent the revisions to those physical parts.

Physical part PP1 256 is shown as derived from engineering design part P1 alt 216 in this example. According to various embodiments, "derived from" means the parts generally correspond to each other, and typically includes having the same part number, shape, design, properties, etc. as the engineering part.

The "JT" indicator in this example indicates that there is a JT shape-structure file associated to that part revision. Shape information is a JT file that represents the geometry of a part, i.e., the shape of the part independent of its position. JT is a 3D data format developed by Siemens PLM Software and is used for product visualization, collaboration, and CAD data exchange. The JT specification has been accepted for publication as an ISO Publicly Available Specification. Of course, while JT is used in this example, JT structures are not necessarily required in all implementations.

The "Tx" boxes indicate there is a transformation matrix associated to the relationship between an engineering part and its parent part that represents the relative position n 3D space of the part in the parent assembly. Each transformation matrix in the design structure 210 aligns with a corresponding link in the physical structure 250.

Various embodiments can compare two physical structures to each other. For example, the system can compare two physical instances of the same product design, two physical products based on different designs or two states of the same physical product at different points in time (e.g. for a product that has parts repaired and replaced over its lifetime), and display the two products to a user with likenesses or distinctions highlighted.

Various embodiments can compare a physical structure to an engineering structure. For example, the system can compare the as-built or as-maintained state of a product to its engineering intent. The comparison can highlight alternate & substitute parts, missing parts and other differences between what was designed and the current configuration of a physical asset.

Various embodiments can compare a physical structure to other lifecycle representations such as a CAD structure, manufacturing process structure, or other. For example, the system can compare the physical state of a product not only to the engineering design from which it was derived, but also to other lifecycle representations of the product that are linked to the engineering design, such as manufacturing structures or simulation structures.

Various embodiments can navigate between a physical part and other lifecycle data. One benefit of managing physical assets in the same system as engineering and other lifecycle data is the ability to store information such as documents, procedures, results, measurements, and other in the single most appropriate place, and be able to easily retrieve that information from any starting point. The system can enable direct access to a user between a design part and its physical instantiations. For example, the system can allow a user to navigate from a component in an Analysis BOM to and from its serialized part in a physical test structure.

Disclosed embodiments can also be used for processing and displaying comparisons and navigations between physical structures and product design structures at a specific "part in position" or occurrence level. For example, a car can have four wheels which in the design structure all have the same part number, but in a specific physical vehicle, the front left wheel may have been replaced with another part number. In such a case, the system comparison can highlight which wheel it is that deviates from the design. Similarly if an engine has been removed from an airplane, the visual representation and the compare can highlight if it is the left or right engine that is missing.

The hybrid BOM Line as disclosed herein can be used to represent physical asset structures to perform processes and make comparisons as described herein. These are accomplished in an efficient manner without need for data duplication, introduction of a complex instancing model for physical structures or an independent mechanism for deriving geometric and positional overrides.

Disclosed embodiments can view, expand, and navigate physical part structures in a consistent manner to traditional engineering structures, even using a greatly simplified persistence model. Various embodiments can analyze and display the physical asset based on its actual current state including installed parts that may deviate from the engineering design, parts currently not installed and reflecting shape or position overrides that differ between the use of a physical part in more than one product.

Manufacturers make significant investment in their engineering and design organizations to maintain and manage detailed geometry and other design data related to their engineered products. Disclosed embodiments leverage this repository of data in an efficient manner to extend existing engineering design constructs for visual representation, viewing and comparison of product designs to actual physical assets that are manufactured. Since one product design can result in hundreds or thousands of physical assets related to it, the potential for being able to access relevant accurate design data in context of a specific physical product significantly increases the footprint and application of the intellectual capital that has been developed. Conventional systems cannot support sophisticated visual representation, navigation and comparison of serialized physical products via leverage of previously developed engineering design data with no replication or synchronization required.

Figure 3:
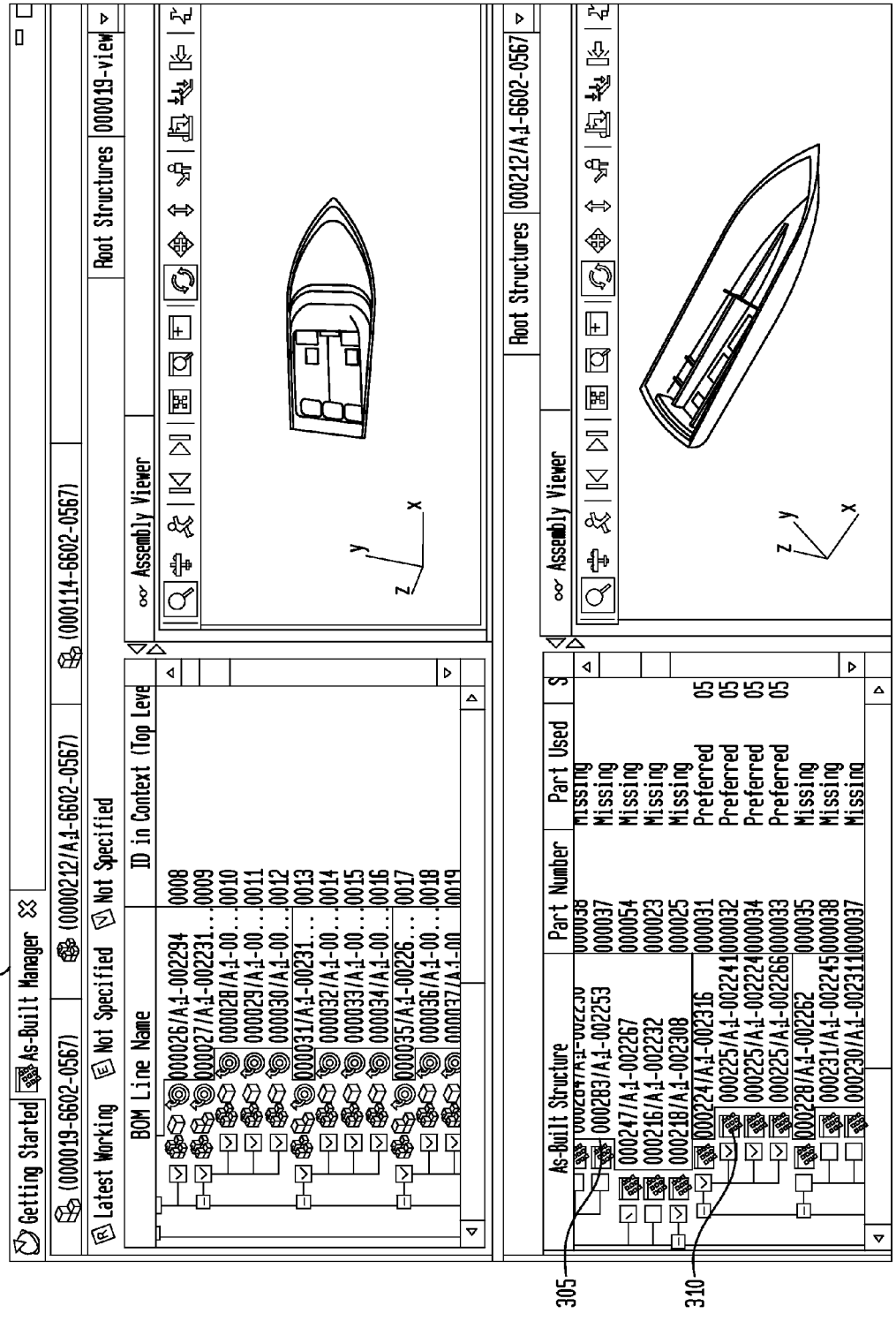
FIG. 3 depicts an example of an output display of a system in accordance with disclosed embodiments.

FIG. 3 depicts an example of an output display of a system in accordance with disclosed embodiments. In this example, display 300 shows BOM window view with a comparison between an engineering design view, in the top half of the display, and an as-built structure view in the bottom half of the display. In this example the overall BOM window view shows two different BOM window views for comparison, and for each of the BOM window views includes both neutral engineering BOM lines view and physical (hybrid) BOM lines views.

On the right side are three-dimensional models of the assembly in accordance with the respective view.

On the left side of the display are BOM Windows for the engineering design view and the as-built structure view, respectively. The data comprising these BOM windows is stored in memory, and comprises a set of BOM lines for each part of the respective assemblies.

As described herein, the engineering design view in various embodiments can include a BOM Window constructed from the persistence model for the specific hierarchy of parts and assemblies, and can include descriptions of parts, features, geometry, and others. The engineering view in the example of FIG. 3 represents the engineering design intent (e.g. the preferred design parts), not necessarily what was actually built; the as-built product may deviate from this design or may have been based on a different design configuration. Note that this engineering design structure displayed in the top panel is typically different from the hypothetical design structure that can be used by the system to produce the bottom "hybrid" view. The hybrid view may show geometry or properties of alternate parts installed, as described below. This hypothetical design structure is used by the system to access accurate geometric information and other engineering properties as the user views and manipulates the physical structure.

As described above, the data from the engineering design can also be combined with the as-built data to produce the as-built BOM window as a hybrid BOM window. The hybrid BOM window, and the constituent hybrid BOM lines, enables the system to display the BOM windows including an indication of each part as it compares to the engineering design. In various embodiments, both engineering and physical structures can each have a corresponding persistent model, each of which can be transformed into a BOM window. The physical BOM window constructs a hypothetical engineering BOM window in the background and appends properties of interest and geometry data to the view of the physical product. The compare in this example is between an engineering design in the top half of the view and a physical instance of that product in the bottom half of the view.

In the example of FIG. 3, note that specific parts 305 are indicated as missing. Other parts 310 are indicated as "Preferred". This allows the user to immediately and intuitively see how the two views differ. The same techniques are used when comparing other alternate views, whether comparing two physical structures, a physical structure with an engineering or other PLM view, or other comparison between different view or configurations.

Of course, the embodiments disclosed herein are not required to display multiple BOM window views at once, as is shown in FIG. 3. In other cases, only one view could be shown, while the various BOM lines in the BOM window can be used to show how the specific view conforms with or differs from other views.

Figure 4:
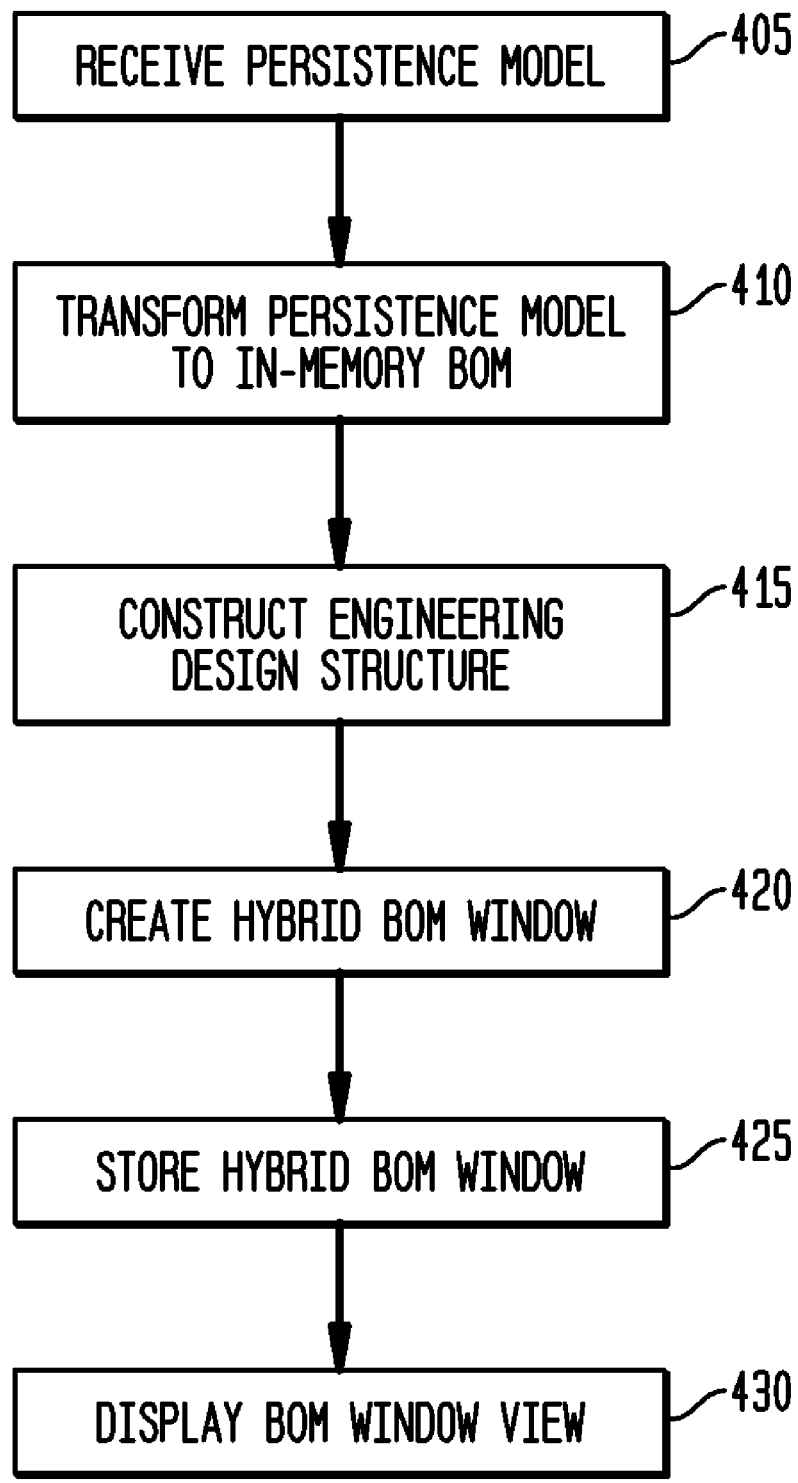
FIG. 4 depicts a flowchart of a process in accordance with disclosed embodiments.

FIG. 4 depicts a flowchart of a process in accordance with disclosed embodiments, as may be implemented, for example, in a PLM system.

The system receives a persistence model of a physical assembly (step 405). Receiving, as used herein, can include loading from storage, receiving from another system such as over a network, receiving through an interaction with a user, and otherwise.

The system transforms the persistence model to an in-memory bill of materials (BOM) window that includes a plurality of BOM lines each corresponding to a physical part (step 410). In some embodiments, this step can include creating a new hybrid BOM window, creating a hybrid BOM line with the physical part and physical part revision, and setting this as the top line in the hybrid BOM window. The as-built (or as-maintained) structure relationships can then be retrieved from the persistent model and used to populate the first level of physical part children for the view.

The system constructs an engineering design structure corresponding to the physical assembly, based on the BOM window (step 415). The engineering design structure includes design data including one or more of alternate parts, substitute parts, deviated parts, or extra parts relative to the design, and can include sub-systems based on different design configurations.

As part of step 415, the physical structure alignment relation can be used to navigate to the design structure and bring back configured geometric information, as described above with relation to FIG. 2. This information can include the transform, which may or may not have been overridden in some context. Further, the derived-from relationship can be navigated to bring back the correct part (even when it is not the preferred part) and that actual design part information can then be populated in the hybrid BOM Line. This results in a "hypothetical" design structure that can be appended to the physical structure in the hybrid BOM line model.

The system combines the engineering design structure with the BOM window to create a hybrid BOM window that includes a plurality of hybrid BOM lines (step 420). Each hybrid BOM line includes both the physical part data of the corresponding BOM line and design data of the corresponding BOM line.

In some embodiments, as part of this step, the first neutral structure relationship can be used to prepare the top hybrid BOM line for expansions. To expand children, the system can first get the physical structure relationships from the parent physical part. Then, for each structure relationship, the system can get the child physical part; create a child hybrid BOM line from the child physical part; get the neutral structure information from each physical structure alignment relationship; get neutral part information, e.g., a part number from a "derived from" relationship; and prepare the child hybrid BOM line with appropriate neutral structure data using the neutral structure information.

Also as part of this step in some embodiments, to get the visualization data, the system can get the neutral part from which the physical part is realized; get the JT data (or other structure data) related to the realized-from neutral part if the physical part is not missing; and retrieve all the transformation data from the neutral occurrence data on the hybrid BOM line.

The system stores the hybrid BOM window (step 425).

The system displays a BOM Window view based on the hybrid BOM window (step 430). This step can include displaying multiple BOM window views, such as simultaneously displaying a first BOM window view (such as an engineering design view or otherwise) and a second BOM window view (such as an as-built view or otherwise), based on the hybrid BOM window, for comparison between them. As described above, each of these views can be, for example, a physical structure view, an engineering design view, a CAD view, another PLM view, or otherwise. Each of the BOM window views can display physical data such as part numbers, part locations, replacement parts, substitute parts, missing parts, and otherwise, as well as other design data such as alternate parts and assemblies, alternate configurations, and otherwise, although typically only the physical or hybrid BOM windows will do so.

In the hybrid BOM window view, the system enables a user to perform functions described herein. For example, in various embodiments, the system can interact with a user via the BOM window view to enable the user to view, expand, and navigate the physical part structures, visualize the physical asset based on its actual current state including installed parts that may deviate from the engineering design, parts currently not installed and reflecting shape or position overrides that differ between the use of a physical part in more than one product, compare a physical product to another physical product (using hybrid BOM windows for different products, constructed as described above), compare a physical product to an engineering definition or any other lifecycle representation that has been linked to the engineering structure (e.g. manufacturing process structure or CAE Analysis structure), and navigate directly from a physical part to its design part counterpart or vice versa.

Disclosed embodiments provide advantages in managing physical products with structures of serialized components. Various embodiments are particularly useful, but not limited to, as-built record management, that is, keeping a historical record of the exact components that were installed on a given manufactured product; maintenance, repair and overhaul, or tracking the configuration of physical assets over their lifetime as they are maintained or repaired; and prototype and testing, or tracking individual prototype products including their configuration, test events and results.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system 100 may conform to any of the various current implementations and practices known in the art.

It is important to note that while the disclosure includes a description in the context of a fully-functional system, those skilled in the art will appreciate that at least portions of the mechanism of the present disclosure are capable of being distributed in the form of a instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke paragraph six of 35 USC §112 unless the exact words "means for" are followed by a participle.

What is claimed is:

1. A method for product display in a product lifecycle management (PLM) system, comprising:
    receiving a persistence model of a physical assembly;
    transforming the persistence model to a bill of materials (BOM) window that includes a plurality of BOM lines each corresponding to a physical part;
    constructing an engineering design structure corresponding to the physical assembly;
    creating a hybrid BOM window by combining the engineering design structure with the BOM window, the hybrid BOM window including a plurality of hybrid BOM lines; and
    displaying a BOM window view based on the hybrid BOM window.

2. The method of claim 1, the engineering design structure is based on the BOM window.

3. The method of claim 2, wherein each of the hybrid BOM lines includes physical part data of a corresponding BOM line and engineering design data of the corresponding BOM line.

4. The method of claim 1, wherein the engineering design data includes at least one of alternate parts, substitute parts, deviated parts, and extra parts.

5. The method of claim 1, wherein the engineering design data includes sub-systems based on different design configurations.

6. The method of claim 1, wherein the BOM window view includes displaying a plurality of BOM window views based on different configurations of the hybrid BOM window.

7. The method of claim 6, where in the different configurations include at least one of a physical structure view, an engineering design view, and a CAD view.

8. A product lifecycle management (PLM) system, comprising a processor and accessible memory, the PLM system particularly configured to perform the steps of:
    receiving a persistence model of a physical assembly;
    transforming the persistence model to a bill of materials (BOM) window that includes a plurality of BOM lines each corresponding to a physical part;
    constructing an engineering design structure corresponding to the physical assembly;
    creating a hybrid BOM window by combining the engineering design structure with the BOM window, the hybrid BOM window including a plurality of hybrid BOM lines; and
    displaying a BOM window view based on the hybrid BOM window.

9. The PLM system of claim 8, the engineering design structure is based on the BOM window.

10. The PLM system of claim 8, wherein each of the hybrid BOM lines includes physical part data of a corresponding BOM line and engineering design data of the corresponding BOM line.

11. The PLM system of claim 8, wherein the engineering design data includes at least one of alternate parts, substitute parts, deviated parts, and extra parts.

12. The PLM system of claim 8, wherein the engineering design data includes sub-systems based on different design configurations.

13. The PLM system of claim 8, wherein the BOM window view includes displaying a plurality of BOM window views based on different configurations of the hybrid BOM window.

14. The PLM system of claim 11, where in the different configurations include at least one of a physical structure view, an engineering design view, and a CAD view.

15. A tangible computer-readable medium encoded with computer-executable instructions that, when executed, cause a data processing system to perform the steps of:
    receiving a persistence model of a physical assembly;
    transforming the persistence model to a bill of materials (BOM) window that includes a plurality of BOM lines each corresponding to a physical part;
    constructing an engineering design structure corresponding to the physical assembly;
    creating a hybrid BOM window by combining the engineering design structure with the BOM window, the hybrid BOM window including a plurality of hybrid BOM lines; and
    displaying a BOM window view based on the hybrid BOM window.

16. The computer-readable medium of claim 15, the engineering design structure is based on the BOM window.

17. The computer-readable medium of claim 15, wherein each of the hybrid BOM lines includes physical part data of a corresponding BOM line and engineering design data of the corresponding BOM line.

18. The computer-readable medium of claim 15, wherein the engineering design data includes at least one of alternate parts, substitute parts, deviated parts, and extra parts.

19. The computer-readable medium of claim 15, wherein the engineering design data includes sub-systems based on different design configurations.

20. The computer-readable medium of claim 15, wherein the BOM window view includes displaying a plurality of BOM window views based on different configurations of the hybrid BOM window, the different configurations including at least one of a physical structure view, an engineering design view, and a CAD view.

* * * * *